(12) United States Patent
Sun et al.

(10) Patent No.: US 9,604,249 B2
(45) Date of Patent: Mar. 28, 2017

(54) INNOVATIVE TOP-COAT APPROACH FOR ADVANCED DEVICE ON-WAFER PARTICLE PERFORMANCE

(71) Applicant: Applied Materials, Inc., Santa Clara, CA (US)

(72) Inventors: Jennifer Y. Sun, Mountain View, CA (US); Biraja P. Kanungo, San Jose, CA (US); Dmitry Lubomirsky, Cupertino, CA (US); Vahid Fioruzdor, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 13/759,525

(22) Filed: Feb. 5, 2013

(65) Prior Publication Data

US 2014/0030533 A1 Jan. 30, 2014

Related U.S. Application Data

(60) Provisional application No. 61/676,235, filed on Jul. 26, 2012.

(51) Int. Cl.
*B05D 3/14* (2006.01)
*H01L 21/67* (2006.01)
*H01J 37/32* (2006.01)
*C23C 18/12* (2006.01)

(52) U.S. Cl.
CPC .......... *B05D 3/147* (2013.01); *C23C 18/1216* (2013.01); *C23C 18/1245* (2013.01); *C23C 18/1254* (2013.01); *C23C 18/1295* (2013.01); *H01J 37/32477* (2013.01); *H01L 21/67* (2013.01)

(58) Field of Classification Search
CPC . B05D 3/147; C23C 18/1216; C23C 18/1245; C23C 18/1254; C23C 18/1295; H01J 37/32477; H01J 21/67; H01L 21/67
USPC .................................................. 427/535, 539
See application file for complete search history.

(56) References Cited

U.S. PATENT DOCUMENTS

| 3,796,182 A | 3/1974 | Rosler |
| 4,399,199 A | 8/1983 | McGill |
| 4,439,248 A | 3/1984 | Herchenroeder et al. |

(Continued)

FOREIGN PATENT DOCUMENTS

| DE | 03/01654 | 6/2003 |
| EP | 0330196 B1 | 8/1989 |

(Continued)

OTHER PUBLICATIONS

Nordson, "What is Plasma?", 2010, p. 1.*

(Continued)

*Primary Examiner* — Katherine A Bareford
*Assistant Examiner* — Christina McClure
(74) *Attorney, Agent, or Firm* — Lowenstein Sandler LLP (57) ABSTRACT

To manufacture a coating for an article for a semiconductor processing chamber, the coating is applied to the article by a method including applying a sol-gel coating of $Y_2O_3$ over the article, and curing the sol-gel coating on the article by heating the article with the sol-gel coating and exposing the article with the sol-gel coating to plasma in a semiconductor manufacturing chamber.

20 Claims, 8 Drawing Sheets

(56) References Cited

U.S. PATENT DOCUMENTS

| | | | |
|---|---|---|---|
| 4,642,440 A | 2/1987 | Schnackel et al. | |
| 4,704,299 A * | 11/1987 | Wielonski et al. | 427/488 |
| 4,880,614 A | 11/1989 | Strangman et al. | |
| 5,381,944 A | 1/1995 | Makowiecki et al. | |
| 5,415,756 A | 5/1995 | Wolfe et al. | |
| 5,532,190 A * | 7/1996 | Goodyear | C23C 16/45512 |
| | | | 118/715 |
| 5,626,923 A | 5/1997 | Fitzgibbons et al. | |
| 5,631,803 A | 5/1997 | Cameron et al. | |
| 5,687,679 A | 11/1997 | Mullin et al. | |
| 5,800,871 A | 9/1998 | Collins et al. | |
| 5,837,058 A | 11/1998 | Chen et al. | |
| 5,853,815 A | 12/1998 | Muehlberger | |
| 5,916,689 A | 6/1999 | Collins et al. | |
| 5,939,219 A * | 8/1999 | Jansing et al. | 429/518 |
| 6,106,959 A | 8/2000 | Vance et al. | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,506,254 B1 | 1/2003 | Bosch et al. | |
| 6,530,990 B2 | 3/2003 | Kong et al. | |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,783,875 B2 | 8/2004 | Yamada et al. | |
| 6,794,059 B2 | 9/2004 | Shanker | |
| 6,805,952 B2 * | 10/2004 | Chang | C23C 4/00 |
| | | | 118/723 R |
| 6,933,254 B2 | 8/2005 | Morita et al. | |
| 6,942,929 B2 | 9/2005 | Han et al. | |
| 7,300,537 B2 | 11/2007 | O'Donnell et al. | |
| 7,351,482 B2 | 4/2008 | Boutwell et al. | |
| 7,441,688 B2 | 10/2008 | Van Heerden et al. | |
| 7,507,268 B2 | 3/2009 | Rosenflanz | |
| 7,510,641 B2 | 3/2009 | Kreiskott et al. | |
| 7,615,133 B2 | 11/2009 | Tateno et al. | |
| 7,648,782 B2 | 1/2010 | Kobayashi et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,810,704 B2 | 10/2010 | Duckham et al. | |
| 7,964,517 B2 | 6/2011 | Jaiswal | |
| 8,034,734 B2 | 10/2011 | Sun et al. | |
| 8,206,829 B2 | 6/2012 | Sun et al. | |
| 8,367,227 B2 | 2/2013 | Sun et al. | |
| 8,404,572 B2 | 3/2013 | Chang et al. | |
| 2001/0003271 A1 | 6/2001 | Otsuki | |
| 2002/0018921 A1 | 2/2002 | Yamada et al. | |
| 2002/0100424 A1 | 8/2002 | Sun et al. | |
| 2003/0007308 A1 | 1/2003 | Harada et al. | |
| 2003/0047802 A1 | 3/2003 | Hiramatsu et al. | |
| 2003/0159657 A1 | 8/2003 | Kaushai et al. | |
| 2003/0185965 A1 | 10/2003 | Lin et al. | |
| 2003/0232139 A1 | 12/2003 | DeTura | |
| 2004/0009297 A1 | 1/2004 | Fusaro, Jr. et al. | |
| 2004/0033385 A1 | 2/2004 | Kaushal et al. | |
| 2004/0110016 A1 | 6/2004 | Hamaya et al. | |
| 2004/0266216 A1 * | 12/2004 | Li et al. | 438/778 |
| 2005/0037193 A1 | 2/2005 | Sun et al. | |
| 2005/0042876 A1 | 2/2005 | Kobayashi et al. | |
| 2005/0056056 A1 | 3/2005 | Wong | |
| 2005/0084654 A1 | 4/2005 | Takahashi et al. | |
| 2005/0266682 A1 | 12/2005 | Chen et al. | |
| 2006/0068189 A1 * | 3/2006 | Raybould et al. | 428/307.3 |
| 2006/0096703 A1 | 5/2006 | Moriya et al. | |
| 2006/0164785 A1 | 7/2006 | Pellegrin | |
| 2007/0006561 A1 | 1/2007 | Brady et al. | |
| 2007/0110915 A1 | 5/2007 | Kitamura et al. | |
| 2007/0169891 A1 | 7/2007 | Koshiishi et al. | |
| 2007/0178396 A1 * | 8/2007 | Wu | G03G 5/102 |
| | | | 430/69 |
| 2007/0212567 A1 | 9/2007 | Esaki et al. | |
| 2007/0218302 A1 | 9/2007 | Kobayashi et al. | |
| 2008/0016684 A1 | 1/2008 | Olechnowicz et al. | |
| 2008/0029032 A1 | 2/2008 | Sun et al. | |
| 2008/0090034 A1 | 4/2008 | Harrison et al. | |
| 2008/0099148 A1 | 5/2008 | Ryabova et al. | |
| 2008/0108225 A1 | 5/2008 | Sun et al. | |
| 2008/0169588 A1 | 7/2008 | Shih et al. | |
| 2008/0174930 A1 | 7/2008 | Hattori et al. | |
| 2008/0213496 A1 * | 9/2008 | Sun | C23C 4/105 |
| | | | 427/453 |
| 2008/0223725 A1 | 9/2008 | Han et al. | |
| 2008/0241412 A1 | 10/2008 | Inaki et al. | |
| 2008/0264564 A1 | 10/2008 | Sun et al. | |
| 2008/0264565 A1 | 10/2008 | Sun et al. | |
| 2008/0268645 A1 | 10/2008 | Kao et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |
| 2009/0036292 A1 | 2/2009 | Sun et al. | |
| 2009/0075486 A1 | 3/2009 | Kikuyama et al. | |
| 2009/0133713 A1 * | 5/2009 | Ohmi et al. | 134/1 |
| 2009/0214825 A1 | 8/2009 | Sun et al. | |
| 2009/0284894 A1 | 11/2009 | Cooke | |
| 2009/0297718 A1 | 12/2009 | Sarrafi-Nour et al. | |
| 2010/0053841 A1 | 3/2010 | Rusinko, Jr. et al. | |
| 2010/0112192 A1 | 5/2010 | Li et al. | |
| 2010/0115961 A1 * | 5/2010 | Chapman | F23G 5/006 |
| | | | 60/780 |
| 2010/0119843 A1 * | 5/2010 | Sun et al. | 428/426 |
| 2010/0160143 A1 | 6/2010 | Sun et al. | |
| 2010/0177454 A1 | 7/2010 | Elliot et al. | |
| 2010/0218472 A1 | 9/2010 | Iyer et al. | |
| 2010/0272982 A1 | 10/2010 | Dickinson et al. | |
| 2010/0314356 A1 | 12/2010 | Nagayama et al. | |
| 2011/0049729 A1 | 3/2011 | Naundorf et al. | |
| 2011/0081782 A1 * | 4/2011 | Liang | C23C 16/345 |
| | | | 438/697 |
| 2011/0086178 A1 | 4/2011 | Ruud et al. | |
| 2011/0135915 A1 * | 6/2011 | Lee et al. | 428/336 |
| 2011/0149462 A1 | 6/2011 | Kugimoto et al. | |
| 2011/0151237 A1 | 6/2011 | Nakano et al. | |
| 2011/0174441 A1 | 7/2011 | Yamashita et al. | |
| 2011/0198034 A1 | 8/2011 | Sun et al. | |
| 2011/0268877 A1 | 11/2011 | Dickson et al. | |
| 2011/0268956 A1 | 11/2011 | Altuna et al. | |
| 2011/0315081 A1 | 12/2011 | Law et al. | |
| 2012/0034469 A1 | 2/2012 | Sun et al. | |
| 2012/0040100 A1 | 2/2012 | Matias et al. | |
| 2012/0076574 A1 | 3/2012 | Parke | |
| 2012/0100299 A1 | 4/2012 | Zajchowski et al. | |
| 2012/0104703 A1 | 5/2012 | Sun et al. | |
| 2012/0125488 A1 | 5/2012 | Sun et al. | |
| 2012/0299253 A1 | 11/2012 | Kosakai et al. | |
| 2012/0307412 A1 | 12/2012 | Boyd, Jr. et al. | |
| 2013/0019797 A1 | 1/2013 | Tanaka et al. | |
| 2013/0026720 A1 | 1/2013 | Hori et al. | |
| 2013/0174983 A1 | 7/2013 | Kikuchi et al. | |
| 2013/0216783 A1 | 8/2013 | Sun et al. | |
| 2013/0216821 A1 | 8/2013 | Sun et al. | |
| 2013/0224675 A1 | 8/2013 | Park | |
| 2013/0273313 A1 | 10/2013 | Sun et al. | |
| 2013/0273327 A1 | 10/2013 | Sun et al. | |
| 2013/0284373 A1 | 10/2013 | Sun et al. | |
| 2013/0288037 A1 | 10/2013 | Sun et al. | |
| 2014/0030486 A1 | 1/2014 | Sun et al. | |

FOREIGN PATENT DOCUMENTS

| | | |
|---|---|---|
| JP | 2002-087878 | 3/2002 |
| JP | 2005-279481 | 10/2005 |
| JP | 2006-027012 | 8/2006 |
| JP | 2007-191794 | 8/2007 |
| JP | 2009-536732 | 10/2009 |
| JP | 2010/106327 | 5/2010 |
| JP | 2010-229492 | 10/2010 |
| KR | 10-2003-0025007 | 3/2003 |
| KR | 10-2007-0013118 | 1/2007 |
| KR | 10-2011-0028378 | 3/2011 |
| KR | 10-2011-0117845 | 10/2011 |
| WO | WO 01/24581 | 4/2001 |
| WO | WO 02/00968 | 1/2002 |
| WO | WO 03/100843 | 12/2003 |

(56) References Cited

FOREIGN PATENT DOCUMENTS

| WO | WO 2013/126466 | 8/2013 |
|---|---|---|
| WO | WO 2013/155220 | 10/2013 |
| WO | WO 2013/162909 | 10/2013 |
| WO | WO 2014/018830 | 1/2014 |
| WO | WO 2014/018835 | 1/2014 |

OTHER PUBLICATIONS

Hench, L.L., West, J.K., "The Sol-Gel Process", 1990, Chem. Rev., 90, p. 33-72.*

Young, S.K., "Sol-Gel Science for Ceramic Materials", 2006, Material Matters, p. 1-4.*

Taffner et al., "Preparation and Microstructural Analysis of High-Performance Ceramics," ASM Handbook vol. 9: Metallography and Microstructures, 2004, 11 pages, ASM International, Materials Park, Ohio, USA.

Bhatia et al., "Mechanisms of ceramic coating deposition in solution-precursor plasma spray," J.Mater. Res., vol. 17, No. 9, Sep. 2002, 10 pages, Materials Research Society, Warrendale, PA, USA.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis" Image Anal Stereol 2011;30:53-62, Published Jan. 27, 2011.

Smith et al., "Very Low Pressure Plasma Spray—A Review of an Emerging Technology in the Thermal Spray Community," Coatings 2011, 1, 117-132, doi: 10.3390/coatings1020117, Published Dec. 20, 2011.

Zircotec—Plasma sprayed ceramic thermal coatings, http://www.zircotec.com/page/plasma-spray-processing/39, downloaded Apr. 4, 2014.

Nakamura et al., "Effects of Pores on Mechanical Properties of Plasma-Sprayed Ceramic Coatings," J. Am. Ceram. Soc., 83 [3] 578-84, Mar. 2000.

Govidarajan et al., "In Situ Particle Generation and Splat Formation During Solution Precursor Plasma Spraying of Yttria-Stabilized Zirconia Coatings," J Am. Ceram. Soc., 1-9 (2011).

"Thermal Spraying," definition, Wikipedia, http://en.wikipedia.org/wiki/Thermal_spraying, downloaded Apr. 14, 2014.

International Search Report for PCT/US2013/052210, mailed Nov. 7, 2013.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

* cited by examiner

INNOVATIVE TOP-COAT APPROACH FOR ADVANCED DEVICE ON-WAFER PARTICLE PERFORMANCE

PRIORITY CLAIM

This application claims the benefit of U.S. Provisional Application Ser. No. 61/676,235 filed on Jul. 26, 2012, which is hereby incorporated by reference.

TECHNICAL FIELD

Embodiments of the present invention relate, in general, to ceramic coated articles and to a process for applying a $Y_2O_3$ sol-gel coating to a substrate.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. However, current multiple etch chamber parts have performance issues because of either high erosion or plasma chemistry interaction.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Embodiments of the invention are directed to a process for coating a substrate with a $Y_2O_3$ sol-gel coating, and to an article created using such a coating process. For example, a sol-gel coating of $Y_2O_3$ can be applied to an article (e.g., a semiconductor manufacturing article). A vacuum can then be applied to the article with the sol-gel coating. The sol-gel coating can be cured on the article by heating the article with the sol-gel coating, and exposing the article with the sol-gel coating to plasma in a chamber (e.g., a semiconductor manufacturing chamber).

Semiconductor manufacturing articles (e.g., chamber components) that can be treated using the sol-gel coating process described herein include, but are not limited to, a dielectric showerhead, a chamber liner and an electrostatic chuck. Other manufacturing articles that may be treated using the sol-gel process include a chamber lid and process kit.

One embodiment includes a thin sol-gel $Y_2O_3$ (Yttria) top coat (e.g., about 20 nm to about 150 nm) over either an existing plasma sprayed $Y_2O_3$ layer or an anodized layer (e.g., about 3 mil (0.003")). The sol-gel process is a wet-chemical technique that may be used for ceramic engineering. The sol-gel process may be used for the fabrication of materials (e.g., metal oxides) starting from a colloidal solution (sol) that acts as the precursor for an integrated network (or gel) of either discrete particles or network polymers. In this chemical procedure, the 'sol' (or solution) gradually evolves towards the formation of a gel-like diphasic system containing both a liquid phase and solid phase whose morphologies range from discrete particles to continuous polymer networks.

Current showerheads can be made of an anodized Al base bonded to a SiC faceplate. Such showerheads may be susceptible to the formation of AlF due to plasma interaction with the anodized Al base. A high erosion rate of the anodized Al base can lead to arcing and can reduce the mean time between cleaning (MTBC) of the showerhead, leading to increased maintenance times and reduced productivity of the semiconductor manufacturing chamber.

Some liner kits can be made of an Al substrate coated with 8-12 mil of plasma sprayed $Y_2O_3$ on an inner side (or interior surfaces) of the liner kit and anodized Al on an outer side (or exterior surfaces) of the liner kit. For specific customer applications at 28 nm device nodes, the on-wafer particle requirement is stringent (e.g., less than 1.3 adders at greater than 45 nm size). Chamber tests using the plasma sprayed $Y_2O_3$ coated liner kits under reducing chemistry have shown on-wafer particle levels, with predominantly $Y_2O_3$ based particles, that are higher than particle requirements (e.g., greater than 100 adders at greater than 45 nm particle size). By significant chamber seasoning (i.e., exposure to etch plasma) of the liner kit (e.g., 100 radio frequency (RF) hours to 120 RF hours), the on-wafer particle requirement can be met. However, lengthy chamber exposure may not be feasible in a production set-up, and increases the cost of the chamber liner kit.

Current electrostatic chucks (ESCs) include an electrostatic puck having a chucking electrode that electrostatically holds (chucks) a supported substrate (e.g., a wafer). Such electrostatic pucks may be composed of ceramics such as $Al_2O_3$ or MN, for example, and may be bonded to an anodized Al base. Plasma chemistry erodes these materials, which may produce on-wafer particles and metal contamination. Additionally, a surface of the electrostatic puck may have features such as mesas and grooves that are filled with helium during processing. When a substrate is supported by the electrostatic chuck, an outer ring on the surface of the electrostatic puck may act as a seal between the substrate and the electrostatic puck. Helium may be pumped into the grooves on the ESC via helium holes in the electrostatic puck to cool the wafer as well as ESC during processing. However, as the surface of the electrostatic puck is exposed to plasma chemistry during in-situ chamber cleaning (ICC), the ESC surface is degraded due to plasma erosion and He leaks at the edges of the ESC (e.g., at the outer seal band). Once He leak reaches a threshold value (~1.5 sccm-standard cubic centimeter per minute) the chamber stops processing. At that point, the ESC has to be taken out and replaced with a new or repaired ESC. This involves chamber down-time and reduces productivity.

A sol-gel coating can be applied over both the $Y_2O_3$ plasma coated side as well as the anodized backside of liner kits. The sol-gel coating can also be applied over the anodized base of ESCs, over the electrostatic puck of ESCs and over showerheads. The sol-gel coating can fill in surface cracks and pores present on plasma coated $Y_2O_3$, and form a sealing layer, such that on-wafer particle performance is improved because particles are less likely to be dislodged from articles with this coating during use.

Figure 1:
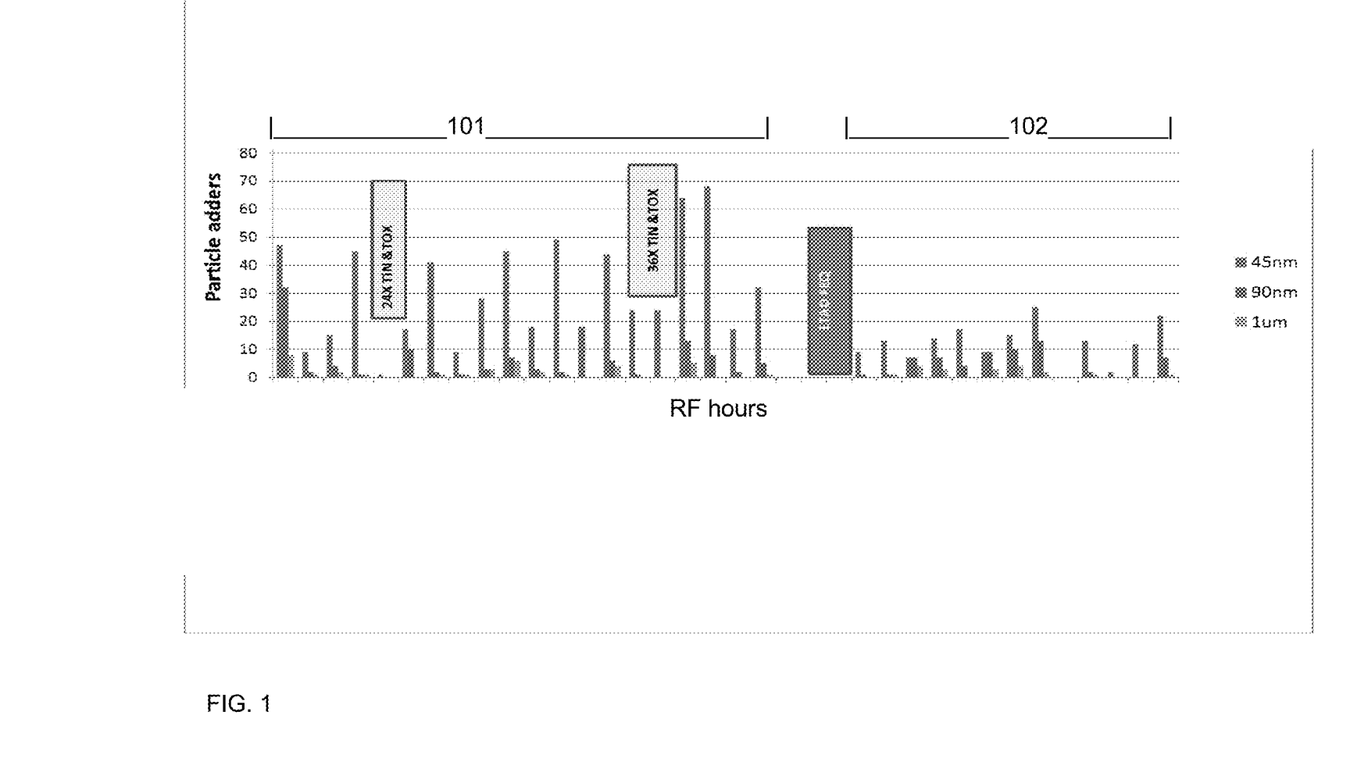
FIG. 1 illustrates chamber on-wafer particle performance showing a number of particle adders over time (RFhrs) for a plasma screen before and after coating application over it according to one embodiment.

FIG. 1 illustrates chamber on-wafer particle performance before and after applying sol-gel $Y_2O_3$ coating to a plasma screen that surrounds the wafer to equalize plasma flow around the wafer (alternatively known as a flow equalizer). Portion 101 shows the number of particle adders over time (RF hours) for a plasma screen with a plasma sprayed $Y_2O_3$ layer and without a sol-gel coating, and portion 102 shows the number of particle adders over time (RF hours) for the same plasma screen after a sol-gel $Y_2O_3$ coating has been applied. Here, particle performance is improved with the addition of the sol-gel coating. In particular, the number of 45 nm adders has been significantly improved with the addition of the sol-gel coating. For example, the number of 45 nm adders ranges from about 10 to about 70 in portion 101, where the sol-gel coating has not been applied, and the number of 45 nm adders ranges from about 0 to about 21 in portion 102, where the sol-gel coating has been applied.

The thickness of the sol-gel coating can be optimized such that the sol-gel fills in cracks and pores of a plasma coated surface, and forms a sealing layer over the surface. For example, a $Y_2O_3$ sol-gel top coat can be applied to the liner kit (e.g., via spraying, dipping, or painting). In the case of spraying, the thickness can be controlled by controlling the number of spray passes. In the case of painting, the thickness can be controlled by the number of paint passes. In the case of dipping, thickness can controlled by dipping time (i.e., higher dip time corresponds to thicker coating).

Figure 2:
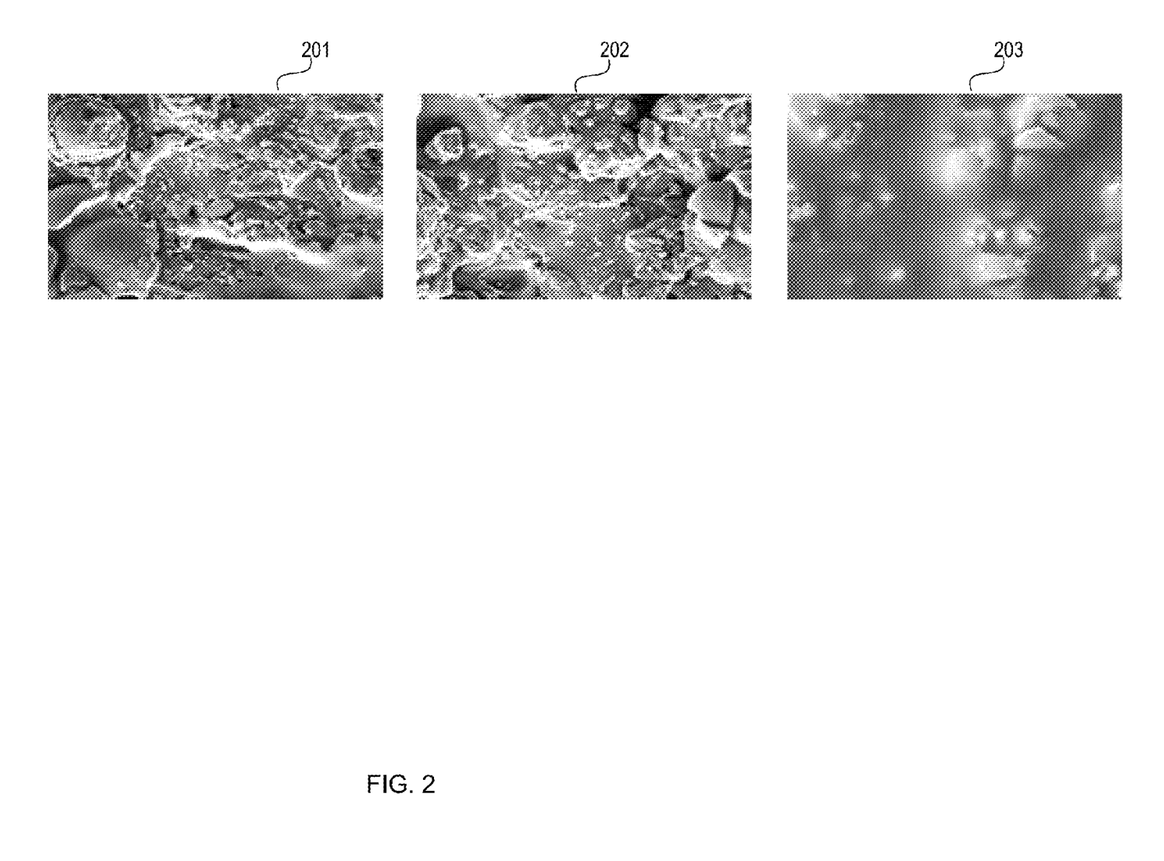
FIG. 2 illustrates a top scanning electron microscope (SEM) view of sol-gel $Y_2O_3$ coatings of various thicknesses over a plasma sprayed $Y_2O_3$ coating according to one embodiment.

FIG. 2 illustrates a top SEM view of sol-gel $Y_2O_3$ coatings of various thicknesses on an article having a plasma coated $Y_2O_3$ layer prior to curing. Image 201 shows a 30 nm sol-gel coating, image 202 shows a 60 nm sol-gel coating, and image 203 shows a 110 nm sol-gel coating. For the 30 nm and 60 nm sol-gel coatings, a significant portion of the sol-gel coating soaks into the cracks of the underlying plasma coated $Y_2O_3$ layer. Further, as shown in the energy-dispersive x-ray spectroscopy (EDS) analysis of table A, Carbon (C) % increases with an increase in coating thickness, which indicates higher sol-gel content. Carbon is a major constituent of the pre-cursor used in sol-gel and hence a higher C content indicates higher sol-gel content.

TABLE A

| Element | Un-cured 30 nm | Un-cured 60 nm | Un-cured 110 nm |
| --- | --- | --- | --- |
| C | 31.71 | 59.87 | 84.56 |
| O | 36.59 | 22.43 | 11.89 |
| Y | 31.69 | 17.71 | 03.55 |

Figure 3A:
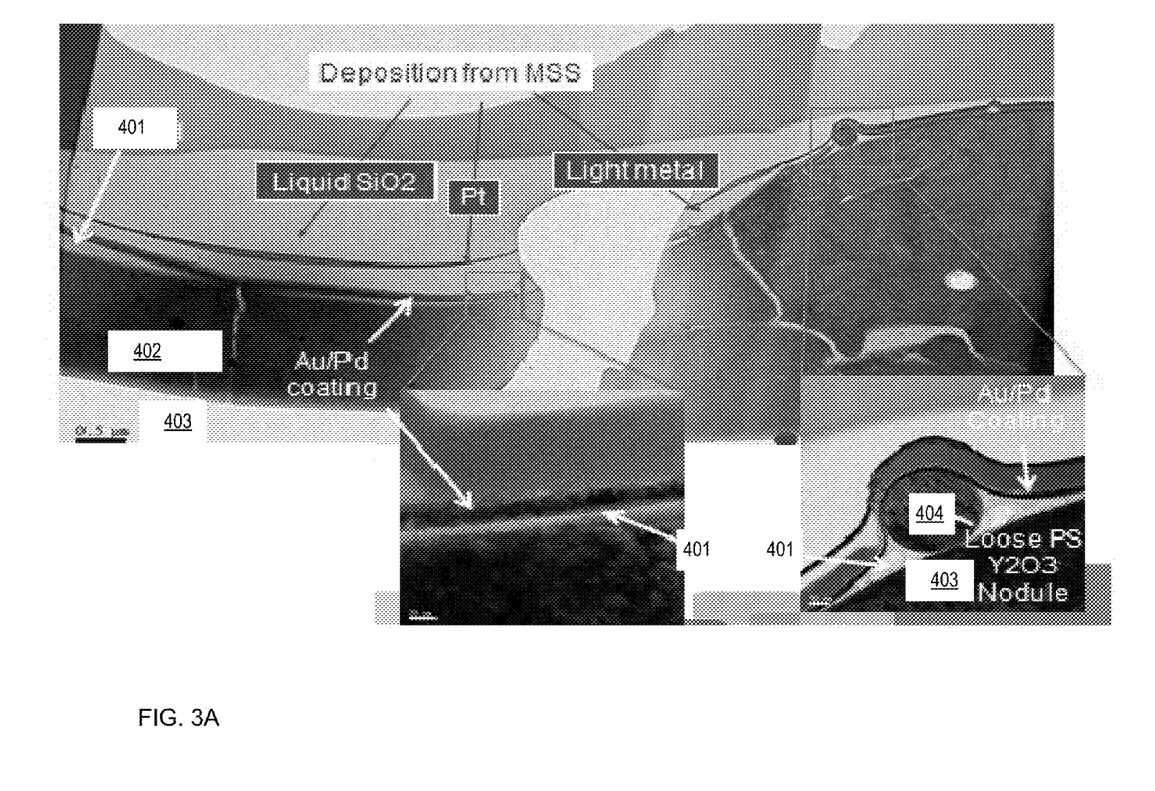
FIG. 3A illustrates a cross-sectional transmission electron microscope (TEM) view of an article with a sol-gel $Y_2O_3$ coating over a plasma sprayed $Y_2O_3$ coating according to one embodiment.

FIG. 3A illustrates a cross-sectional TEM view of an article 403 with a plasma coated $Y_2O_3$ layer 402 with a 60 nm un-cured sol-gel coating 401 over the plasma coated $Y_2O_3$ layer 402. Here, the sol-gel coating 401 forms a sealing layer over the plasma coated $Y_2O_3$ layer 402 on the article 403. Further, capillary force wicks the sol-gel coating 401 into cracks on the plasma coated $Y_2O_3$ layer. Additionally, a loose $Y_2O_3$ nodule 404 is sealed by the sol-gel coating 401. Here, there is a minimum sol-gel coating 401 near the cracks, because the sol-gel coating has been wicked into the cracks. Additionally, there is a 10 nm to 200 nm coating away from the cracks.

Figure 3B:
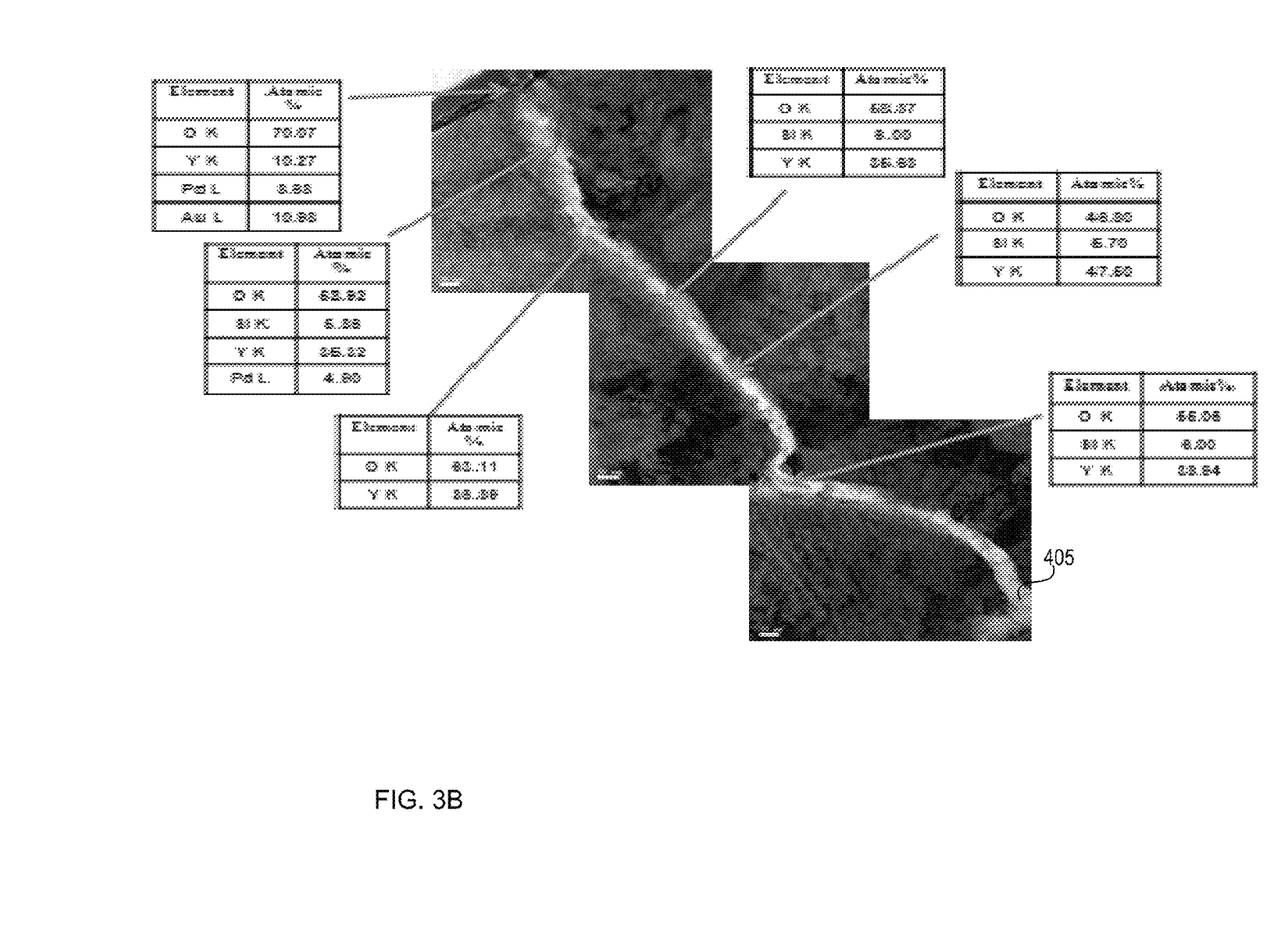
FIG. 3B illustrates a top TEM view of an article with a sol-gel $Y_2O_3$ coating over a plasma sprayed $Y_2O_3$ coating according to one embodiment.

FIG. 3B illustrates a top TEM view of an article with a 60 nm un-cured sol-gel $Y_2O_3$ coating. The sol-gel coating can be seen filling (or partially filling) in a crack 405. EDS analysis shows the presence of Y and O elements deep in to the surface cracks on the plasma coated $Y_2O_3$ layer, confirming the crack are filled with sol-gel $Y_2O_3$.

In one embodiment, the article is placed in a vacuum prior to curing of the sol-gel coating. Here, the vacuum can improve penetration of the sol-gel coating into pores and cracks in the article or in the plasma coated $Y_2O_3$ layer on the article.

Though sol-gel $Y_2O_3$ coatings can be cured thermally (e.g., at about 400 degrees C.), articles having a plasma sprayed coating over bare Al substrate have a high coefficient of thermal expansion (CTE) mismatch between the plasma coated $Y_2O_3$ layer and the Al substrate at elevated temperatures. Therefore, conventional thermal curing for these articles may not be feasible. In one embodiment, sol-gel coated articles can be cured using plasma assisted in-situ curing at lower temperatures. Curing of the sol-gel layer at low temperature can be achieved by plasma assisted in-chamber curing. This can be achieved in-situ in a plasma etch chamber prior to running the etching sequence by methods such as $CH_4/O_2$ plasma assisted curing, $O_2$ plasma assisted curing, $O_3$ assisted curing, $O_2$ radical assisted curing.

For example, after application, the sol-gel coating can be cured in a two-step process, where the article with the sol-gel coating is first thermally cured at about 110 degrees C. for about six hours, and is then cured in-chamber via plasma assisted curing. Though the thermal curing and the plasma assisted curing can be performed sequentially, the thermal curing and the plasma assisted curing can alternatively occur in parallel (e.g., such that the sol-gel is exposed to a plasma assisted curing process at an elevated temperature). Further, the duration of the exposure to plasma for curing, along with other parameters of the plasma assisted curing, can be optimized for the particular application and article. For example, the article may be cured in the following plasma assisted conditions: (1) $O_3$ plasma—10 slm (standard liters per minute) $O_3$ flow, 130 degrees C.; (2) $O_2$ radical plasma—3500 sccm $O_2$+350 sccm $N_2$, pressure at 2 T, source power at 5000 W, pedestal at 130 degrees C. for 5 min; (3) $O_2$ plasma—He pressure at 4 T, chamber pressure at 40 mT, source power at 1750 W, $O_2$ flowed at 200 sccm (standard cubic cm per minute) for 15 min; or (4) $CH_4/O_2$ plasma—He pressure at 8 T, chamber pressure at 40 mT, source power at 1000 W, ESC 90 degrees C., $CH_4/O_2$ flow ratio of 20/200 sccm for 15 min. All the above plasma assisted curing processes can be run longer (~2-48 hr) to completely cure liner kit component or articles of similar geometry.

Figure 4:
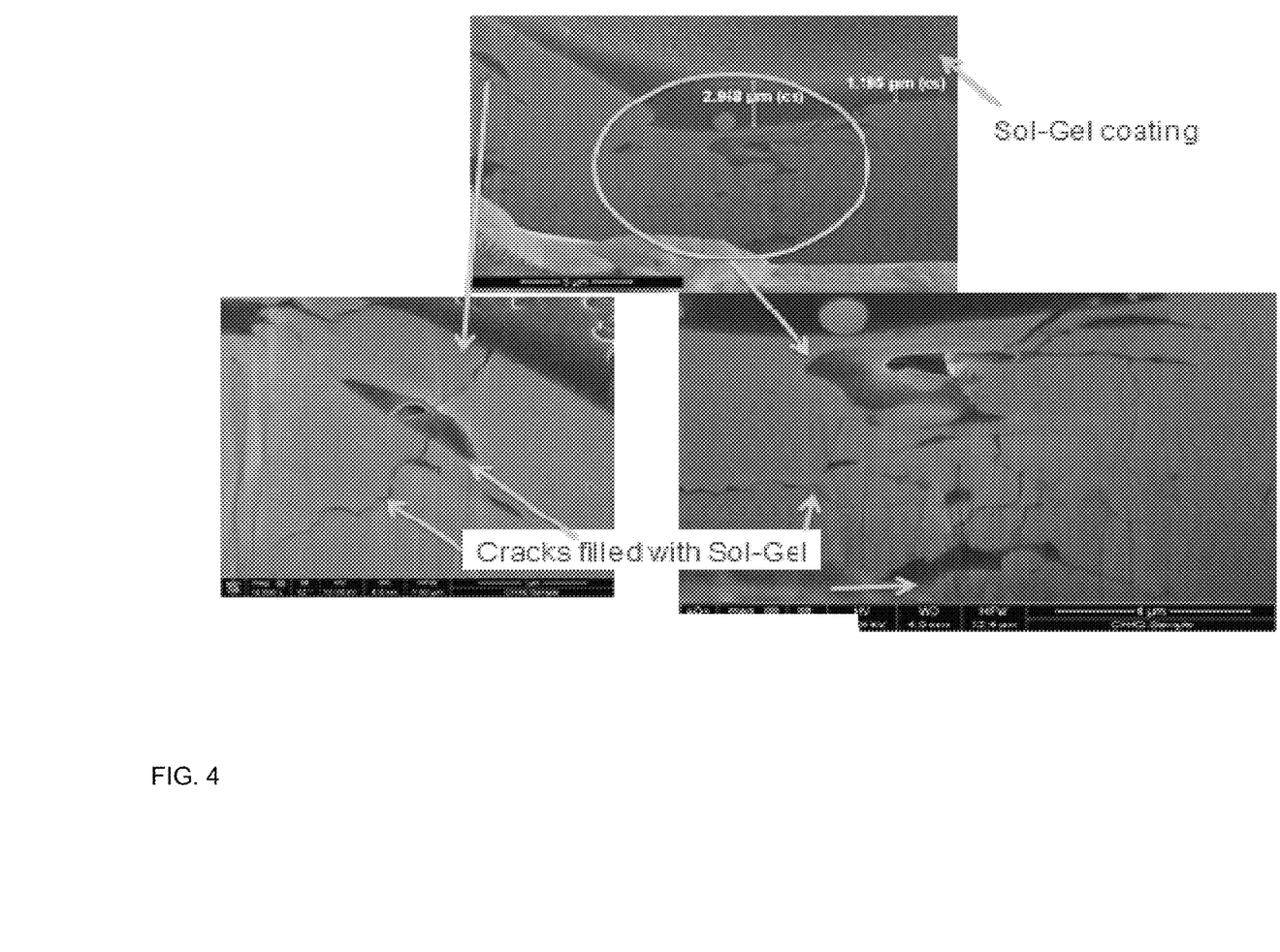
FIG. 4 illustrates a cross-sectional focused ion beam (FIB) view of an article with a sol-gel $Y_2O_3$ coating over a plasma sprayed $Y_2O_3$ coating according to one embodiment.

FIG. 4 illustrates a cross-sectional focused ion beam (FIB) view of an article with a plasma coated $Y_2O_3$ layer and with a cured sol-gel $Y_2O_3$ coating. Here, the sol-gel penetrates deeply into the cracks of the $Y_2O_3$ layer and fills them. However, the thickness of the sol-gel coating can vary depending on the local surface roughness.

Figure 5:
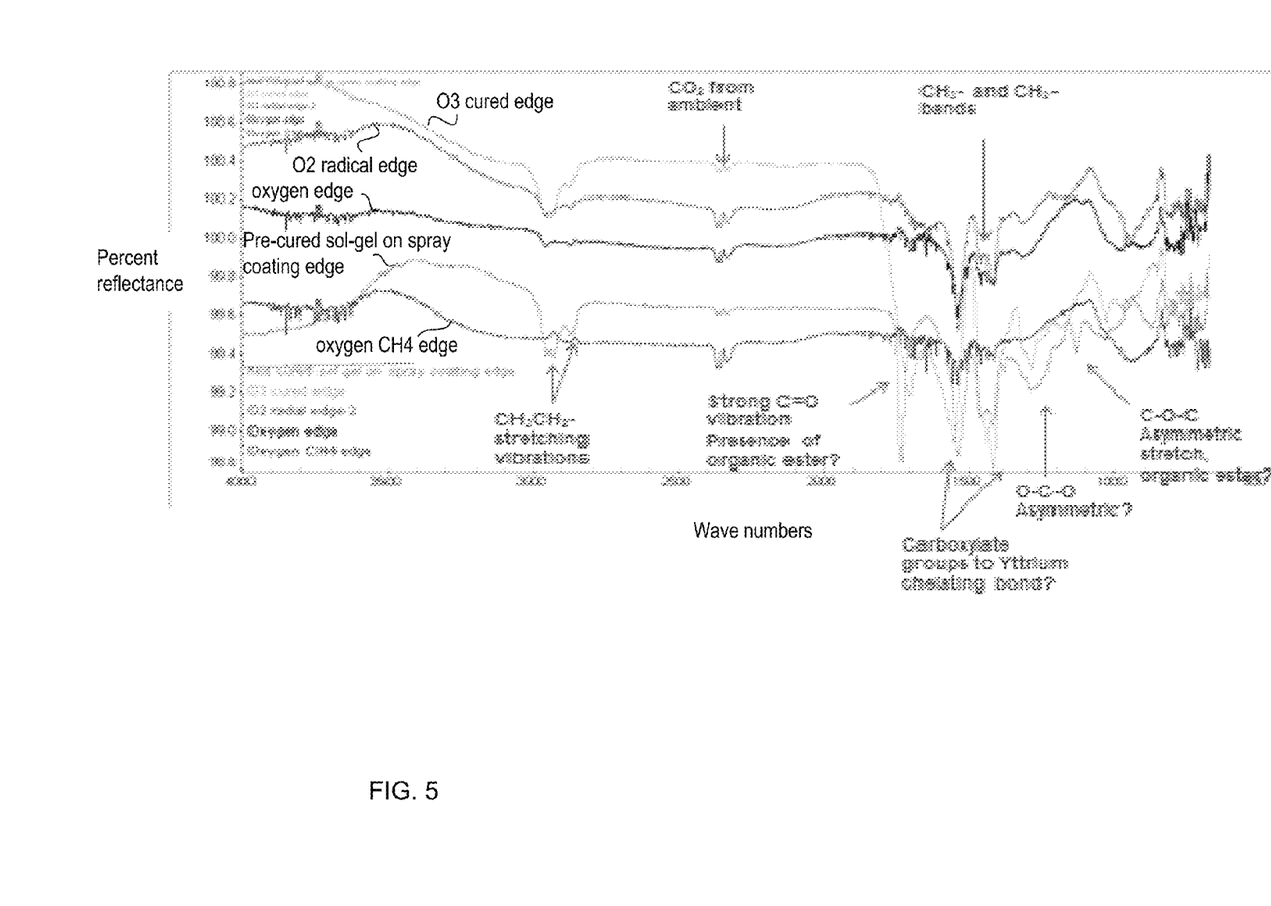
FIG. 5 illustrates a Fourier transform infrared spectroscopy (FTIR) analysis of various curing methods for the sol-gel $Y_2O_3$ coating according embodiments.

FIG. 5 illustrates a Fourier transform infrared spectroscopy (FTIR) analysis showing bonding states as a percentage of reflectance over wave numbers for various in-situ curing methods for a 110 nm $Y_2O_3$ sol-gel coating. Various different plasma chemistries may be used to perform the plasma assisted curing. Experimentation has shown that a $CH_4/O_2$ (oxygen $CH_4$ edge) plasma curing process may be more effective at reducing undesirable $CH_3/CH_2$ stretching vibrations and $CH_3$ and $CH_2$ bands than an $O_2$ plasma curing process (Oxygen edge) (which was the second most effective of the tested methods). The $O_2$ plasma curing process (Oxygen edge) may be more effective than an $O_2$ radical curing process ($O_2$ radical edge) (which was the third most effective of the tested methods), which in turn may be more effective than an $O_3$ radical curing process ($O_3$ cured edge) (which was the least effective of the tested methods), as compared to the pre-cured sol-gel coating on spray coating edge. $CH_3/CH_2$ stretching vibrations are signs confirming a presence of significant pre-cursors. The goal of curing is to reduce or eliminate the pre-cursors. Therefore, curing that shows fewer $CH_3/CH_2$ stretching vibration confirms more effective curing of the sol-gel coating.

Post-curing, the thickness of the sol-gel coating can shrink by about 100 times. The thickness of the sol-gel coating can be optimized such that the sol-gel fills in the cracks and pores as well as forms a sealing layer once the sol-gel coating is cured. In one liner kit example, a post-cure thickness of about 110 nm sol-gel over the plasma sprayed $Y_2O_3$ layer is desirable.

Due to the sealing of the surface cracks and pores of underlying surfaces using the sol-gel technique, articles with the sol-gel coating can be cleaned with aggressive chemistries without chemically attacking the underneath substrate or degrading the coating adhesion, allowing for a wider and robust cleaning process window. Further, the erosion of all parts having anodized layers and plasma sprayed layers can be improved by the sol-gel coating, which fills in the cracks and pores, hence reducing plasma interaction.

Figure 6A:
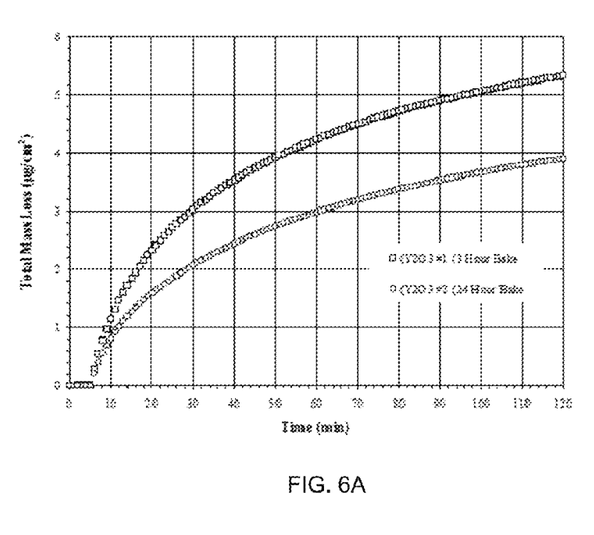
FIG. 6A illustrates outgassing showing total mass loss over time for a plasma sprayed $Y_2O_3$ coating.
Figure 6B:
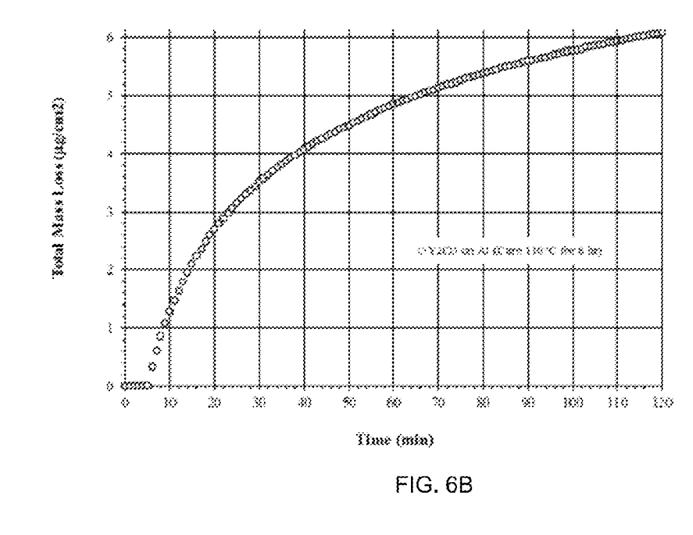
FIG. 6B illustrates outgassing showing total mass loss over time for a sol-gel $Y_2O_3$ coating over a plasma sprayed $Y_2O_3$ coating according to one embodiment.

One property of articles for chamber use is a level of outgassing of the chamber components, where it is desirable to have a minimum of outgassing. FIG. 6A illustrates outgassing showing total mass loss over time for a plasma coated $Y_2O_3$ layer baked for about 3 hours to about 24 hours, and FIG. 6B illustrates outgassing showing total mass loss over time for a plasma coated $Y_2O_3$ layer with a sol-gel $Y_2O_3$ coating. Here, the outgassing results show comparable outgassing rates between plasma sprayed $Y_2O_3$ with and without the sol-gel sealing coating. In other words, the sol-gel coating does not significantly increase outgassing.

Figure 7:
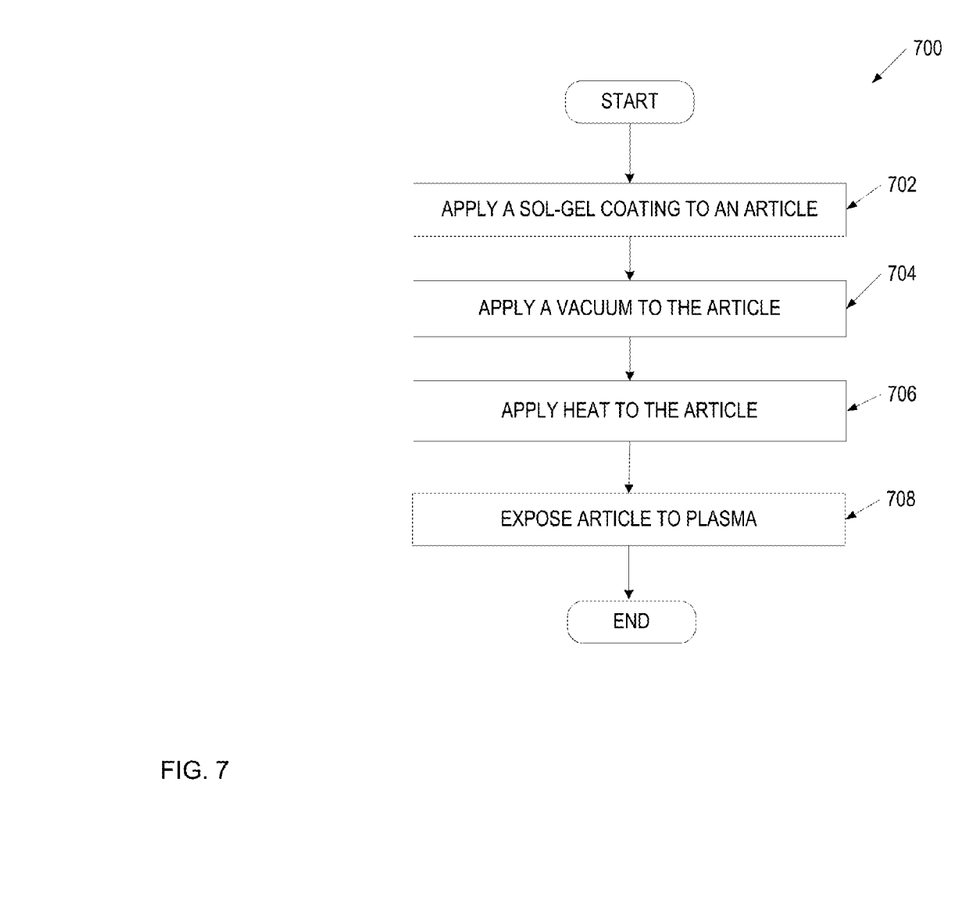
FIG. 7 illustrates a method according to one embodiment.

FIG. 7 illustrates a method 700 of coating an article with a sol-gel layer of $Y_2O_3$. The article may be an electrostatic chuck, a showerhead, a chamber liner kit, or other chamber component. The article may be an anodized metal, a ceramic (e.g., AlN, $Al_2O_3$, $Y_2O_3$, etc.), or other materials. In this method 700 at step 702, the sol-gel of $Y_2O_3$ can be applied (e.g., via spraying, dipping, or painting) to an article (e.g., a liner kit, a showerhead, or an ESC).

At step 704, a vacuum can be optionally applied to the article after the sol-gel coating is applied, such that the sol-gel coating will better penetrate into the cracks and pores in the article (especially if the article is plasma coated). The magnitude and duration of the vacuum can be optimized for the particular article. For example, the vacuum can be applied in a range from about 10 mT to about 300 mT, and the vacuum can be applied for a time period in a range from about 1 hours to about 12 hours.

At step 706, the article with the sol-gel coating applied can be heated. For example, the article with the sol-gel applied can be heated to about 100 degrees C. for about six hours. The temperature and duration can be optimized for the particular article. For example, the article can be heated to a temperature in a range from about 100 C to about 500 C, for a time period in a range from about 1 hour to about 12 hours.

At step 708, the article with the sol-gel coating applied can be exposed to plasma in-situ curing. In other words, the article can be installed in a plasma etch chamber to be exposed to the plasma. For the sol-gel coated article can be installed into a chamber that it will be used in, and can be exposed to a $CH_4/O_2$ plasma (or other plasma) to cure the sol-gel coating. Subsequent to the plasma assisted curing process, the sol-gel coated article may remain in the chamber, and may be used to process substrates (e.g., wafers). For example, an ESC having a sol-gel coating may be installed in a chamber of a plasma etcher before the sol-gel coating has been cured. Prior to any wafer being processed in that chamber, a plasma assisted curing process may be performed to cure the sol-gel coating. In one embodiment, the article can be exposed to the plasma for a time period in a range from about 2 hours to about 24 hours.

In an alternative embodiment, the article can be heated and exposed to plasma at the same time. In one embodiment, the heat treatment and the plasma assisted curing are both performed in-situ. Alternatively, the heat treatment and plasma assisted curing may be performed on a sol-gel coated article together in a separate processing chamber from the one in which that article will be used (e.g., in a different type of process chamber than a type that it will be used in).

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, the term "about" means plus or minus 10 percent.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    applying a sol-gel coating of $Y_2O_3$ over a plasma sprayed coating of $Y_2O_3$ on a first side of an article comprising a metal base, wherein the sol-gel coating has an un-cured thickness of up to around 11 microns, and wherein a combined material composition of the sol-gel coating in an un-cured state and of the plasma sprayed coating comprises 31.71-84.56 at. % C, 11.89-36.59 at. % O and 3.55-31.69 at. % Y;
    applying a vacuum to the article with the sol-gel coating after all of the sol-gel coating has been applied to the article; and
    curing the sol-gel coating on the article after applying the vacuum to the article, wherein the curing is performed in a two-part curing process that comprises:
        first performing thermal curing of the sol-gel coating by heating the article with the sol-gel coating to a temperature of about 110-500 degrees C. to partially cure the sol-gel coating; and
        subsequently performing plasma assisted curing of the sol-gel coating to completely cure the sol-gel coating by exposing the article with the sol-gel coating to plasma, wherein the sol-gel coating has a composition that causes the sol-gel coating to shrink by approximately 100 times from the un-cured thickness, and wherein the sol-gel coating has a cured thickness of up to around 110 nm after the curing.

2. The method of claim 1, wherein applying the vacuum to the article with the sol-gel coating comprises applying a vacuum of about 10 mTorr to about 300 mTorr to the article with the sol-gel coating for about 1 hour to about 12 hours.

3. The method of claim 1, wherein the thermal curing is performed for about 2 hours to about 10 hours.

4. The method of claim 1, wherein exposing the article with the sol-gel coating to plasma in a semiconductor manufacturing chamber comprises:
    flowing $CH_4$ and $O_2$ at a flow ratio of about 1 sccm of $CH_4$ per 10 sccm of $O_2$;
    generating a $CH_4/O_2$ plasma from a mixture of the $CH_4$ and the $O_2$; and
    exposing the article with the sol-gel coating to the $CH_4/O_2$ plasma.

5. The method of claim 4, wherein exposing the article with the sol-gel coating to the plasma in the semiconductor manufacturing chamber comprises:
    flowing the $CH_4$ at a flow rate of about 20 sccm; and
    flowing the $O_2$ at a flow rate of about 200 sccm;
    wherein the article with the sol-gel coating is exposed to the $CH_4/O_2$ plasma at a temperature of about 90° C. for a duration of at least 15 minutes.

6. The method of claim 1, wherein the article comprises one of a dielectric showerhead, a chamber liner or an electrostatic chuck.

7. The method of claim 1, further comprising:
    installing the article into a processing chamber in which the article will be used for processing of wafers before the sol-gel coating is cured, wherein the thermal curing and the plasma assisted curing are performed in-situ in the processing chamber.

8. The method of claim 1, wherein the plasma sprayed coating has a thickness of about 8-12 mil, and wherein the sol-gel coating of $Y_2O_3$ coats the plasma sprayed coating of $Y_2O_3$.

9. The method of claim 1, wherein the article further comprises an anodization layer, the anodization layer having a thickness of about 3 mil, and wherein the sol-gel coating of $Y_2O_3$ coats the anodization layer.

10. The method of claim 1, wherein
    the thermal curing of the sol-gel coating comprises heating the article with the sol-gel coating to a temperature of 160-500 degrees C. to partially cure the sol-gel coating.

11. The method of claim 1, wherein the vacuum causes a capillary force that wicks the sol-gel coating into surface cracks in the plasma sprayed coating of $Y_2O_3$, and wherein the sol-gel coating forms a sealing layer over the plasma sprayed coating of $Y_2O_3$.

12. The method of claim 1, further comprising:
    installing the article into a processing chamber in which the article will be used for processing of wafers after the sol-gel coating is partially cured and before the sol-gel coating is completely cured, wherein the plasma assisted curing is performed in-situ in the processing chamber.

13. The method of claim 1, wherein exposing the article with the sol-gel coating to plasma in a semiconductor manufacturing chamber comprises:
    flowing $O_3$ at a flow rate of about 10 slm;
    generating an $O_3$ plasma from the $O_3$; and
    exposing the article with the sol-gel coating to the $O_3$ plasma at a temperature of about 130° C.

14. The method of claim 1, wherein exposing the article with the sol-gel coating to plasma in a semiconductor manufacturing chamber comprises:
    flowing $O_2$ at a flow rate of about 3500 sccm;
    flowing $N_2$ at a flow rate of about 350 sccm;
    generating an $O_2$ radical plasma; and
    exposing the article with the sol-gel coating to the $O_2$ radical plasma at a temperature of about 130° C.

15. The method of claim 1, wherein exposing the article with the sol-gel coating to plasma in a semiconductor manufacturing chamber comprises:
    flowing $O_2$ at a flow rate of about 200 sccm;
    generating an $O_2$ plasma from the $O_2$; and
    exposing the article with the sol-gel coating to the $O_2$ plasma.

16. The method of claim 1, wherein a second side of the article comprises an anodization layer, the method further comprising:
applying a second sol-gel coating of $Y_2O_3$ over the anodization layer on the second side of the article;
wherein the vacuum is applied to the article after the second sol-gel coating has been applied over the anodization layer on the second side of the article; and
curing the second sol-gel coating based on the heating of the article and the exposing of the article to the plasma.

17. The method of claim 1, wherein the sol-gel coating has an uncured material composition comprising one of:
31.71 at. % C, 36.59 at. % O and 31.69 at. % Y;
59.87 at. % C, 22.43 at. % O and 17.71 at. % Y; or
84.56 at. % C, 11.89 at. % O and 3.55 at. % Y.

18. A method comprising:
applying a sol-gel coating of a yttrium containing oxide over an article comprising a plasma sprayed ceramic coating of $Y_2O_3$, wherein the sol-gel coating has an un-cured thickness of up to around 11 microns;
applying a vacuum to the article with the sol-gel coating after all of the sol-gel coating has been applied to the article; and
curing the sol-gel coating on the article after applying the vacuum to the article, wherein curing the sol-gel coating comprises:
first performing thermal curing of the sol-gel coating by heating the article with the sol-gel coating to a temperature of about 110-500 degrees C. to partially cure the sol-gel coating; and
subsequently performing plasma assisted curing of the sol-gel coating to completely cure the sol-gel coating by exposing the article with the sol-gel coating to plasma, the exposing comprising:
flowing $CH_4$ and $O_2$ at a flow ratio of about 1 sccm of $CH_4$ per 10 sccm of $O_2$; and
generating a $CH_4/O_2$ plasma from a mixture of the $CH_4$ and the $O_2$,
wherein the sol-gel coating has a composition that causes the sol-gel coating to shrink by approximately 100 times from the un-cured thickness, and wherein the sol-gel coating has a cured thickness of up to around 110 nm after the curing.

19. A method comprising:
applying a sol-gel coating of a yttrium containing oxide over an article comprising a plasma sprayed ceramic coating of $Y_2O_3$, wherein the sol-gel coating has an un-cured thickness;
applying a vacuum to the article with the sol-gel coating after all of the sol-gel coating has been applied to the article; and
curing the sol-gel coating on the article after applying the vacuum to the article by performing a two-part curing process comprising:
first performing thermal curing of the sol-gel coating by heating the article to a temperature of about 110-500 degrees C. to partially cure the sol-gel coating; and
subsequently performing plasma assisted curing of the sol-gel coating to completely cure the sol-gel coating by exposing the article with the sol-gel coating to a plasma, wherein the plasma assisted curing is performed in-situ in a processing chamber, wherein the sol-gel coating has a composition that causes the sol-gel coating to shrink by approximately 100 times from the un-cured thickness.

20. The method of claim 19, wherein a combined material composition of the sol-gel coating in an un-cured state and of the plasma sprayed coating comprises 31.71-84.56 at. % C, 11.89-36.59 at. % O and 3.55-31.69 at. % Y.

* * * * *